United States Patent
Schroeder et al.

(10) Patent No.: US 6,735,232 B2
(45) Date of Patent: May 11, 2004

(54) LASER WITH VERSATILE OUTPUT ENERGY

(75) Inventors: Thomas Schroeder, Goettingen (DE); Michael Gehrke, Kalefeld (DE)

(73) Assignee: Lambda Physik AG, Goettingen (DE)

( * ) Notice: Subject to any disclaimer, the term of this patent is extended or adjusted under 35 U.S.C. 154(b) by 65 days.

(21) Appl. No.: 09/774,238

(22) Filed: Jan. 29, 2001

(65) Prior Publication Data

US 2002/0021730 A1 Feb. 21, 2002

Related U.S. Application Data

(60) Provisional application No. 60/178,620, filed on Jan. 27, 2000.

(51) Int. Cl.[7] .................................................. H01S 3/22
(52) U.S. Cl. ........................................... 372/57; 372/58
(58) Field of Search ........................... 372/55–58, 59, 372/61, 29.021, 29.022, 108

(56) References Cited

U.S. PATENT DOCUMENTS

| | | | |
|---|---|---|---|
| 4,393,505 A | 7/1983 | Fahlen ......................... 372/57 |
| 4,399,540 A | 8/1983 | Bücher ......................... 372/20 |
| 4,611,270 A | 9/1986 | Klauminzer et al. ........ 364/183 |
| 4,616,908 A | 10/1986 | King .......................... 350/576 |
| 4,691,322 A | 9/1987 | Nozue et al. ................. 372/82 |
| 4,829,536 A | 5/1989 | Kajiyama et al. ............. 372/57 |
| 4,856,018 A | 8/1989 | Nozue et al. ................. 372/98 |
| 4,860,300 A | 8/1989 | Baumler et al. ............... 372/57 |
| 4,905,243 A | 2/1990 | Lokai et al. .................. 372/32 |
| 4,916,707 A | 4/1990 | Rosenkranz .................. 372/38 |
| 4,926,428 A | 5/1990 | Kajiyama et al. ............. 372/20 |
| 4,975,919 A | 12/1990 | Amada et al. ................. 372/33 |
| 4,977,573 A | 12/1990 | Bittenson et al. ............. 372/81 |
| 5,025,445 A | 6/1991 | Anderson et al. ............. 372/20 |
| 5,095,492 A | 3/1992 | Sandstrom ................... 372/102 |
| 5,103,454 A | 4/1992 | McKee ........................ 372/29 |
| 5,142,543 A | 8/1992 | Wakabayashi et al. ......... 372/32 |
| 5,150,370 A | 9/1992 | Furuya et al. ............... 372/106 |
| 5,221,823 A | 6/1993 | Usui ....................... 219/121.78 |
| 5,226,050 A | 7/1993 | Burghardt ................... 372/20 |
| 5,260,961 A | * 11/1993 | Zhou et al. ................... 372/57 |
| 5,337,330 A | 8/1994 | Larson ........................ 372/86 |
| 5,377,215 A | * 12/1994 | Das et al. ..................... 372/57 |
| 5,396,514 A | 3/1995 | Voss ........................... 372/57 |
| 5,404,366 A | 4/1995 | Wakabayashi et al. ......... 372/29 |
| 5,450,207 A | 9/1995 | Fomenkov ................... 356/416 |
| 5,450,436 A | * 9/1995 | Mizoguchi et al. ............ 372/59 |
| 5,535,233 A | 7/1996 | Mizoguchi et al. ............ 372/87 |
| 5,557,629 A | 9/1996 | Mizoguchi et al. ............ 372/87 |
| 5,559,584 A | 9/1996 | Miyaji et al. ................. 355/73 |
| 5,559,816 A | 9/1996 | Basting et al. ................ 372/27 |
| 5,586,134 A | * 12/1996 | Das et al. ................. 372/38.03 |
| 5,596,596 A | 1/1997 | Wakabayashi et al. ....... 372/102 |
| 5,659,419 A | 8/1997 | Lokai et al. ................. 359/330 |
| 5,663,973 A | 9/1997 | Stamm et al. ................. 372/20 |
| 5,684,822 A | 11/1997 | Partlo ......................... 372/95 |
| 5,729,562 A | 3/1998 | Birx et al. .................... 372/38 |
| 5,729,565 A | 3/1998 | Meller et al. .................. 372/87 |
| 5,748,346 A | 5/1998 | David et al. .................. 359/15 |
| 5,761,236 A | 6/1998 | Kleinschmidt et al. ...... 372/100 |

(List continued on next page.)

FOREIGN PATENT DOCUMENTS

DE 298 22 090 3/1999 ............. H01S/3/08

*Primary Examiner*—Paul Ip
*Assistant Examiner*—Tuan Nguyen
(74) *Attorney, Agent, or Firm*—Stallman & Pollock LLP

(57) ABSTRACT

A method of operating a laser system for increasing the lifetimes of optical components of the resonator includes the steps of configuring the laser system to initially output laser pulses at an energy in a range above a predetermined energy for industrial lithographic processing, and attenuating the energy of the output pulses to the predetermined energy. A further step includes reducing an amount of attenuation as optics of the laser resonator age to maintain the laser pulses at the predetermined energy, or reducing the amount of attenuation to produce pulses having a higher energy than the predetermined energy.

21 Claims, 5 Drawing Sheets

U.S. PATENT DOCUMENTS

| | | | |
|---|---|---|---|
| 5,763,855 A | 6/1998 | Shioji | 219/121.84 |
| 5,802,094 A | 9/1998 | Wakabayashi et al. | 372/57 |
| 5,811,753 A | 9/1998 | Weick et al. | 219/121.78 |
| 5,818,865 A | 10/1998 | Watson et al. | 372/86 |
| 5,835,520 A * | 11/1998 | Das et al. | 372/57 |
| 5,852,627 A | 12/1998 | Ershov | 372/108 |
| 5,856,991 A * | 1/1999 | Ershov | 372/57 |
| 5,898,725 A | 4/1999 | Fomenkov et al. | 372/102 |
| 5,901,163 A | 5/1999 | Ershov | 372/20 |
| 5,901,167 A * | 5/1999 | Sukhman et al. | 372/58 |
| 5,914,974 A | 6/1999 | Partlo et al. | 372/38 |
| 5,917,849 A | 6/1999 | Ershov | 372/102 |
| 5,936,988 A | 8/1999 | Partlo et al. | 372/38 |
| 5,940,421 A | 8/1999 | Partlo et al. | 372/38 |
| 5,946,337 A | 8/1999 | Govorkov et al. | 372/92 |
| 5,949,806 A | 9/1999 | Ness et al. | 372/38 |
| 5,970,082 A | 10/1999 | Ershov | 372/102 |
| 5,978,391 A | 11/1999 | Das et al. | 372/20 |
| 5,978,394 A | 11/1999 | Newman et al. | 372/32 |
| 5,978,406 A | 11/1999 | Rokni et al. | 372/58 |
| 5,978,409 A | 11/1999 | Das et al. | 372/100 |
| 5,982,795 A | 11/1999 | Rothweil et al. | 372/38 |
| 5,982,800 A | 11/1999 | Ishihara et al. | 372/57 |
| 5,989,725 A | 11/1999 | Bullard et al. | 428/516 |
| 5,991,324 A * | 11/1999 | Knowles et al. | 372/57 |
| 5,999,318 A | 12/1999 | Morton et al. | 359/572 |
| 6,005,880 A | 12/1999 | Basting et al. | 372/38 |
| 6,014,206 A | 1/2000 | Basting et al. | 356/138 |
| 6,014,398 A | 1/2000 | Hofmann et al. | 372/60 |
| 6,018,537 A * | 1/2000 | Hofmann et al. | 372/25 |
| 6,020,723 A | 2/2000 | Desor et al. | 320/166 |
| 6,028,872 A | 2/2000 | Partlo et al. | 372/38 |
| 6,028,880 A | 2/2000 | Carlesi et al. | 372/58 |
| 6,061,382 A | 5/2000 | Govorkov et al. | 372/101 |
| 6,081,542 A | 6/2000 | Scaggs | 372/70 |
| 6,128,323 A * | 10/2000 | Myers et al. | 372/38.1 |
| 6,154,470 A | 11/2000 | Basting et al. | 372/19 |
| 6,157,662 A | 12/2000 | Scaggs et al. | 372/60 |
| 6,160,831 A | 12/2000 | Kleinschmidt et al. | 372/57 |
| 6,160,832 A | 12/2000 | Kleinschmidt et al. | 372/57 |
| 6,243,405 B1 * | 6/2001 | Borneis et al. | 372/25 |
| 6,381,256 B1 * | 4/2002 | Stamm et al. | 372/100 |
| 6,421,365 B1 * | 7/2002 | Kleinschmidt et al. | 372/108 |
| 6,424,666 B1 * | 7/2002 | Stamm | 372/100 |
| 6,442,182 B1 * | 8/2002 | Govorkov et al. | 372/102 |

* cited by examiner

LASER WITH VERSATILE OUTPUT ENERGY

PRIORITY

This application claims the benefit of priority to United States provisional patent application No. 60/178,620, filed Jan. 27, 2000.

BACKGROUND OF THE INVENTION

1. Field of the Invention

The invention relates to lasers, and particularly high repetition rate, line narrowed excimer and molecular fluorine lasers for operation at specified pulse energies.

2. Discussion of the Related Art

Semiconductor manufacturers are currently using deep ultraviolet (DUV) lithography tools based on KrF-excimer laser systems operating around 248 nm, as well as the following generation of ArF-excimer laser systems operating around 193 nm. Vacuum UV (VUV) lithography uses the molecular fluorine (F2) laser operating around 157 nm.

Higher energy, higher efficiency excimer and molecular fluorine lasers are being developed as lithographic exposure tools for producing very small structures as chip manufacturing proceeds deeper into the sub-0.18 micron regime. Specific characteristics of laser systems sought to be improved upon particularly for the lithography market include higher repetition rates, increased energy stability and dose control, increased lifetimes of optical components, increased percentage of laser system operation "uptime", narrower output emission linewidths, improved wavelength and bandwidth calibration and stability, and improved compatibility with stepper/scanner imaging systems.

It is important for their respective applications to the field of sub-quarter micron silicon processing that each of the above laser systems become capable of emitting a narrow spectral band of known bandwidth and around a very precisely determined and finely adjustable absolute wavelength. Techniques for reducing bandwidths by special resonator designs to less than 100 pm for use with all-reflective optical imaging systems, and for catadioptric imaging systems to less than 0.6 pm, are being continuously improved upon.

A line-narrowed excimer or molecular fluorine laser used for microlithography provides an output beam with specified narrow spectral bandwidth. Narrowing of the bandwidth is generally achieved through the use of a bandwidth narrowing and/or wavelength selection and wavelength tuning module (hereinafter "line-narrowing module") including most commonly prisms, diffraction gratings and, in some cases, optical etalons. The line-narrowing module typically functions to disperse incoming light angularly such that light rays of the beam with different wavelengths are reflected at different angles. Only those rays fitting into a certain "acceptance" angle of the resonator undergo further amplification, and eventually contribute to the output of the laser system.

Parameters of the line-narrowing module such as the magnitude of angular dispersion, reflectivity for specific wavelengths, linearity (i.e. absence of wavefront distortions), scattering of the beam, etc., will thus affect the performance of the laser. The optical components, i.e., prisms, gratings, etalons, etc., of the line-narrowing module undergo changes that reduce their performance with prolonged energy doses of laser power. This reduced performance of the line-narrowing module is attributed to "aging" of the optical components, wherein particularly the optical surfaces take on defects resulting in reduced efficiency.

Line-narrowed excimer and molecular fluorine lasers are particularly required to emit pulses of predetermined energy for precise industrial processing. The energy of the output laser beam depends on the composition and quality of the gas mixture, the input energy to the discharge and the efficiency of the laser resonator including the line-narrowing optics. The gas mixture is typically replenished online using careful monitoring and gas control procedures and the input energy to the discharge is processor-controlled typically using an expert control system. The initial efficiency of the resonator can be optimized by careful selection and arrangement of line-narrowing components. However, as the optical components and the laser tube itself age, the efficiency of the laser decreases steadily from its initial optimum state.

It is recognized herein that the pulse energy can be maintained at the required level, when laser efficiency is reduced by aging, by increasing the driving discharge voltage, as illustrated at FIG. 1. The range $\Delta E$ represents the pulse energy range within which the operating laser is required to emit laser pulses (the extent of $\Delta E$ is exaggerated for illustration in FIG. 1). The range $\Delta HV$ represents the voltage range within which the input discharge voltage may be adjusted in order to produce the desired pulse energies. An absolute limitation of $\Delta HV$ is imposed by physical constraints on the components of the gas discharge laser, while a practical limitation may be imposed by laser performance considerations (see U.S. patent application No. 60/171,717, which is assigned to the same assignee and is hereby incorporated by reference).

Referring to FIG. 1, curve 1 represents the energy versus driving voltage curve for a laser having a new line-narrowing module and laser tube, or a line-narrowing module and laser tube wherein the components, particularly the optics, have not yet aged. Curves 2–4 are energy versus driving voltage curves for laser systems having line-narrowing modules at various aging states from less aging to more aging.

When components such as the optics and the laser tube are new, and curve 1 is the relevant E-V curve, the driving voltage can be adjusted to as low as $HV_{min}$ and the desired pulse energies are achieved. The highest available pulse energy of the laser system is $E_{max}$, as shown, wherein the discharge voltage is set at $HV_{max}$ and the laser is operating with new optics according to curve 1, even though $E_{max}$ would lie outside the acceptable range of pulse emission energies. When the optics are aged such the laser is operating according to curve 2, application of only $HV_{min}$ to the discharge will no longer achieve the desired pulse energies. However, by increasing the input voltage, pulse energies in the desired range $\Delta E$ are easily achieved. At a further stage of aging of the optics, the laser operates along curve 3 when only input voltages at or near $HV_{max}$ will produce the desired pulse energies. When the optics have aged further such the laser is operating according to curve 4, the desired pulse energies are no longer achievable.

Before the aging stage is reached wherein the laser operates according to curve 4, the line-narrowing module is typically replaced with a new one so that the laser can again operate according to curve 1, and the process repeats itself. The duration between when the laser operates along curve 1 with new optics and when the laser can no longer produce pulse energies in the desired range $\Delta E$ is known as the "lifetime" of the line-narrowing module, or the lifetime of the optics. At some point, the laser tube itself ages such that even with a new line-narrowing module, the laser cannot produce the desired pulse energies. At this point, the laser tube has reached the end of its "lifetime".

Replacing the line-narrowing module implies servicing and can result in undesirable service cost and downtime of the laser system. It is desired to increase the lifetime of the line-narrowing module and optics.

SUMMARY OF THE INVENTION

It is therefore an object of the invention to provide an excimer or molecular fluorine laser system having a line-narrowing module and/or other optical components with increased lifetimes over conventional systems.

In accord with the above object, a laser system, particularly an excimer or molecular fluorine laser system, includes a laser tube filled with a gas mixture and having a plurality of electrodes therein connected to a discharge circuit for energizing the gas mixture, and a resonator including a line-narrowing or line-selection module for generating a line-narrowed laser beam. The laser system includes an attenuator module for attenuating the pulse energy of the laser beam. The preferred attenuator module is disposed outside of the resonator for reducing the pulse energy of the output beam.

The laser system is preferably configured such that the operating discharge voltage range $\Delta HV$ is higher than for conventional systems, such that the discharge circuit applies higher energy electrical pulses to the discharge than conventional laser systems, and particularly such that when the line-narrowing module is new, the minimum achievable pulse energy is above a desired pulse energy, i.e., when the discharge voltage is set to $HV_{min}$. The energy pulses output from the laser resonator are attenuated by the attenuator module to the desired energy.

The attenuator module is preferably configured to exhibit variable attenuation, and is particularly preferred to exhibit such variable attenuation in steps. Thus, as the optics of the line-narrowing module and/or the laser tube age, the attenuation is reduced accordingly so that the laser system continues to achieve the desired pulse energies.

The attenuator module may comprise a series of partially reflective plates, preferably each being arranged at Brewster's angle, each having a different reflectivity coefficient. The attenuator module is adjustable so that one of the plates may be selected that corresponds to the attenuation desired depending on the aging stage of the line-narrowing module and/or the laser tube.

The attenuator module may comprise one or more plates each having a coating for reflecting a unique percentage of incident light of a particular polarization, such as π-polarized light. The resonator of the laser is configured to output a substantially polarized beam, such as exhibiting π-polarization upwards of 95%–97%. The π-polarization of the beam may be produced by using Brewster surfaces such as the windows on the laser tube or a prism surface or otherwise. The polarization of the beam may be produced using a polarization plate in the resonator.

Advantageously, the effective lifetime of the line-narrowing module and/or the laser tube is increased by using a high attenuation when the line-narrowing module and/or laser tube is new, and a decreasing attenuation percentage as the line-narrowing optics and/or laser tube age. Further, operation at higher energies than is typically desired is possible when the line-narrowing optics are particularly new, such as by reducing the attenuation percentage.

INCORPORATION BY REFERENCE

Each reference cited in the detailed description of the preferred embodiment herein is, in addition to those references cited above and below herein, including that which is described as background, and the above invention summary, are hereby incorporated by reference into the detailed description of the preferred embodiment below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the detailed description of the preferred embodiment with the same effect as just described.

DETAILED DESCRIPTION OF THE PREFERRED EMBODIMENTS

Figure 2:
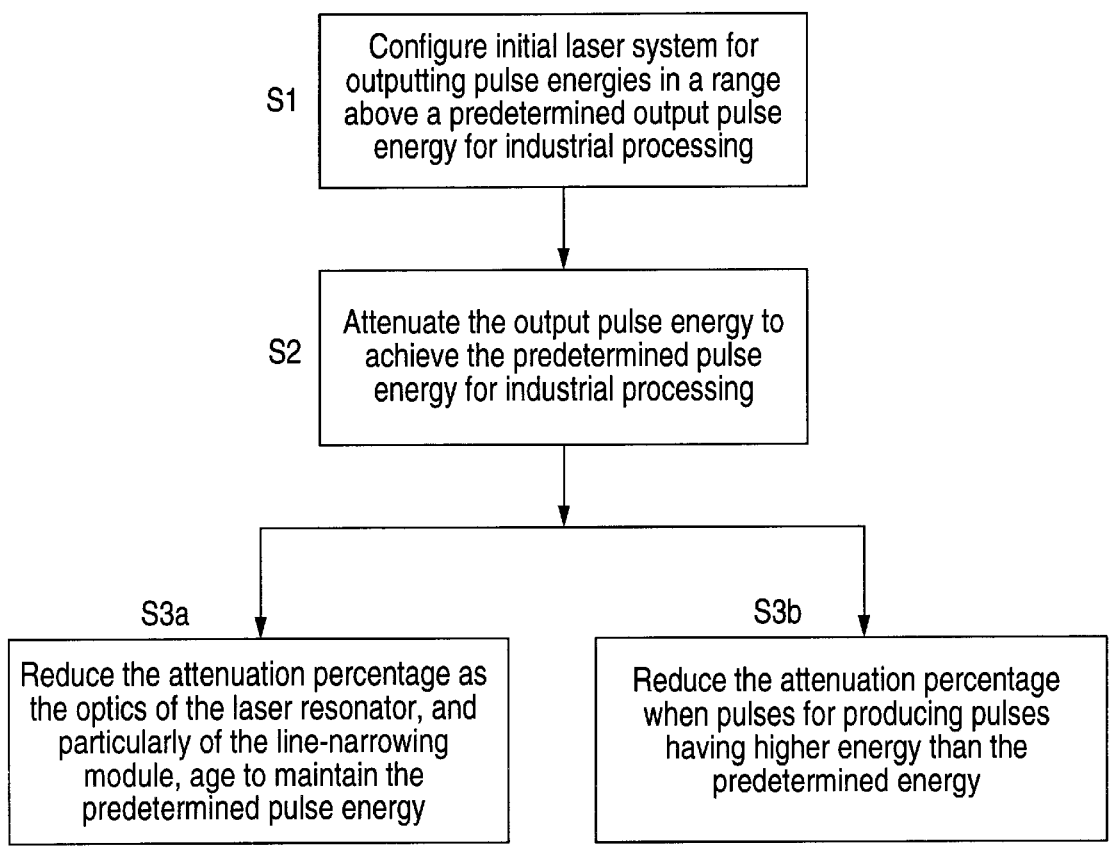
FIG. 2 is a flow chart showing the steps of preferred methods for increasing the lifetime of a line-narrowing module of a laser system and/or for producing higher output pulse energies each in accord with preferred embodiments.

FIG. 2 is a flow chart showing steps of first and second preferred methods, respectively, for increasing the lifetime of a line-narrowing module and/or the laser tube of a laser system and for producing higher output pulse energies. The first step S1 shown in FIG. 2 is to configure a laser system for outputting pulse energies in a range above a predetermined output pulse energy for industrial processing.

High voltage power supplies connected to solid state pulser modules are configured to apply a voltage to the electrodes within a discharge chamber of a laser so that the laser produces output pulses at a predetermined energy $E_0$ (typically a few milliJoules for excimer and molecular fluorine lithography gas discharge lasers). Preferred discharge circuits and electrodes are described U.S. patent applications No. 60/128,227, Ser. No. 09/692,265, Nos. 60/149,392, 60/184,705, 60/204,095, Ser. Nos. 09/390,146, and 09/247,887 and U.S. Pat. Nos. 6,020,723 and 6,005,880, each of which is assigned to the same assignee as the present application, and at U.S. Pat. Nos. 5,729,565 and 4,860,300, all of the above patents and patent application being hereby incorporated by reference.

The predetermined energy $E_0$ is specified by the industrial processing that the laser is to be used for. The discharge circuit is then configured to operate to apply a voltage to the electrodes of the laser system within a range of voltages, such as $HV_{min} < HV < HV_{max}$, where $\Delta HV = HV_{max} - HV_{min}$.

The range of applied voltages can produce pulse energies in a range $E_{min} < E_0 < E_{max}$, where $\Delta E = E_{max} - E_{min}$, wherein the boundary values $E_{min}$ and $E_{max}$ on the energy range $\Delta E$ depend on such factors as the age of the optics, the laser tube and the gas mixture of the laser. A conventional laser system is configured such that when the resonator optics, and particularly the line-narrowing module and/or the laser tube, are new and have not aged, the energy of output pulses is around $E_0$ when the discharge circuit operates around $HV_{min}$, as discussed above.

In contrast, the energy of output pulses is above $E_0$ when the discharge circuit of the laser system in accord with the preferred embodiment operates around $HV_{min}$. The second step S2 shown in FIG. 2 is attenuating the output pulse energy to achieve the predetermined pulse energy $E_0$ specified for its intended industrial processing use. Thus, the laser system is preferably configured such that it is not capable of emitting output pulses of energy $E_0$ without attenuating the pulses in accord with step S2.

Step S3a shown in FIG. 2 is to reduce the attenuation percentage as the optics of the laser resonator, and particularly of the line-narrowing module and/or the laser tube, age, to produce the predetermined pulse energy $E_0$. Advantageously, after a certain amount of laser operation, the percentage of attenuation is reduced as the optics and/or the laser tube age in accord with a preferred method. After the same amount of laser operation, service engineers are replacing line-narrowing modules of conventional laser systems resulting in excessive laser system downtime and cost.

With particular respect to lithography laser systems such as excimer lasers, e.g., KrF and ArF lasers, or molecular fluorine ($F_2$) lasers, reducing laser downtime for servicing is advantageous. Lithographic processing systems for producing features on semiconductor wafers are typically desired to operate continuously for having a largest throughput possible. Greater throughput means greater commercial advantage to the chip makers who use the laser system in their lithography systems together with an imaging system and a stepper/scanner machine. Greater throughput is advantageously realized according to the preferred embodiment because optics of the laser system, and particularly the line-narrowing module that typically includes refractive optics that age due to exposure to a DUV or VUV laser beam, are replaced less often, and thus the laser system is taken down less often to perform the replacement.

Another advantage of the preferred embodiment is that the driving voltage HV may be maintained around a particular value, and only varied within a small range based on pulse-to-pulse or moving average pulse energy stability or burst overshoot control considerations, rather than making large HV range changes based on aging of optics. The attenuation may be reduced rather than increasing HV on average due to the aging. Advantageously, the average value of HV can be relatively constant, and parameters that may vary with HV will not be varied other than in a localized pulse-to-pulse sense, or over a far smaller range than its operating capable range, while the lifetime of the optics and/or laser tube and/or gas mixture is/are increased according to controlling the attenuation according to the preferred embodiments.

Step S3b shown in FIG. 2 is reducing the attenuation percentage when pulses having higher energy than the predetermined energy $E_0$ are desired for industrial or other use. Advantageously, the maximum energy $E'_{max}$ achievable with the laser system of the preferred embodiment is greater than the maximum energy $E_{max}$ achievable with conventional laser systems.

Figure 1:
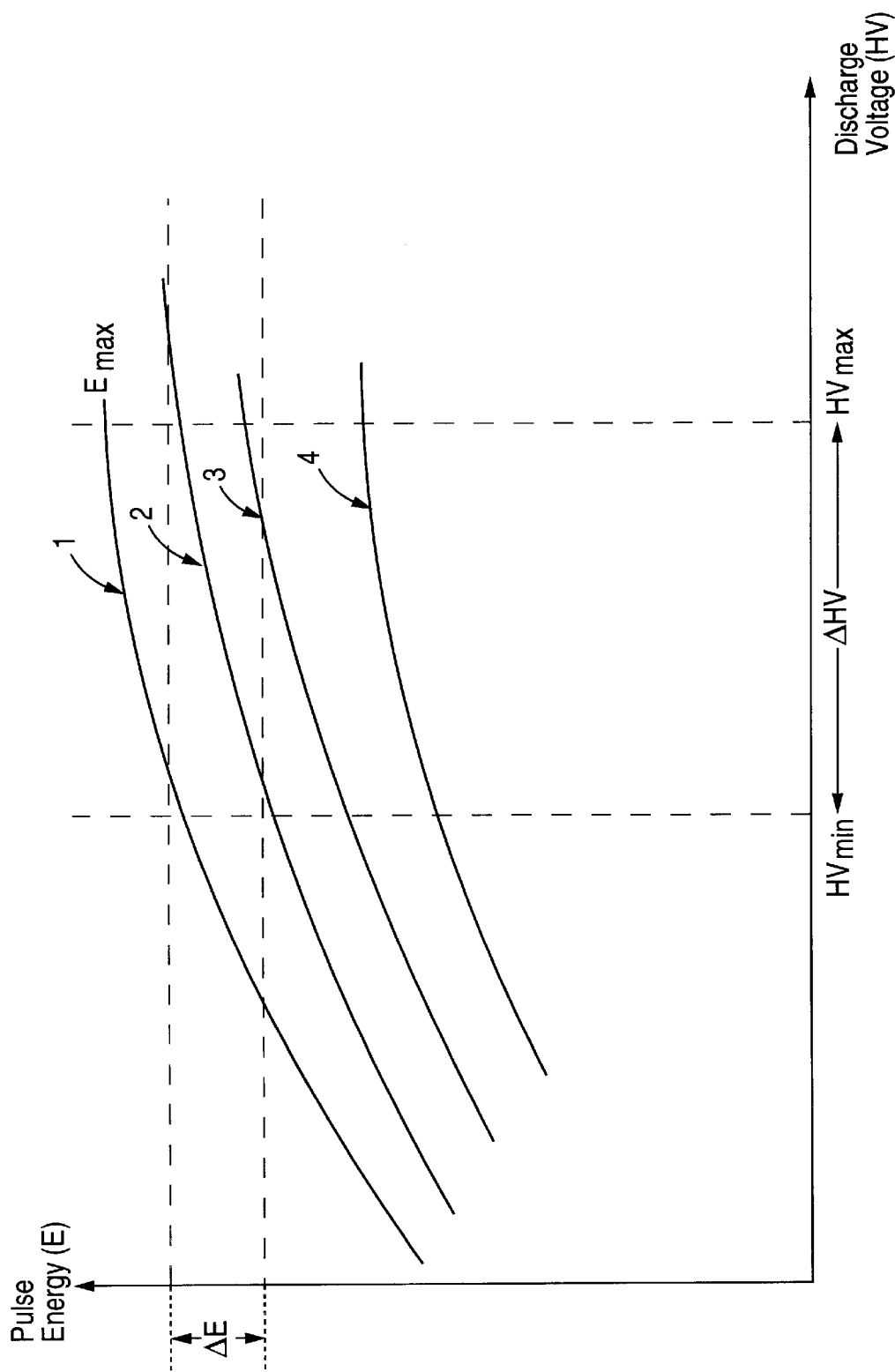
FIG. 1 shows various plots of pulse energy versus discharge voltage corresponding to various stages of aging of the optics of the line-narrowing module of a conventional laser system.
Figure 3:
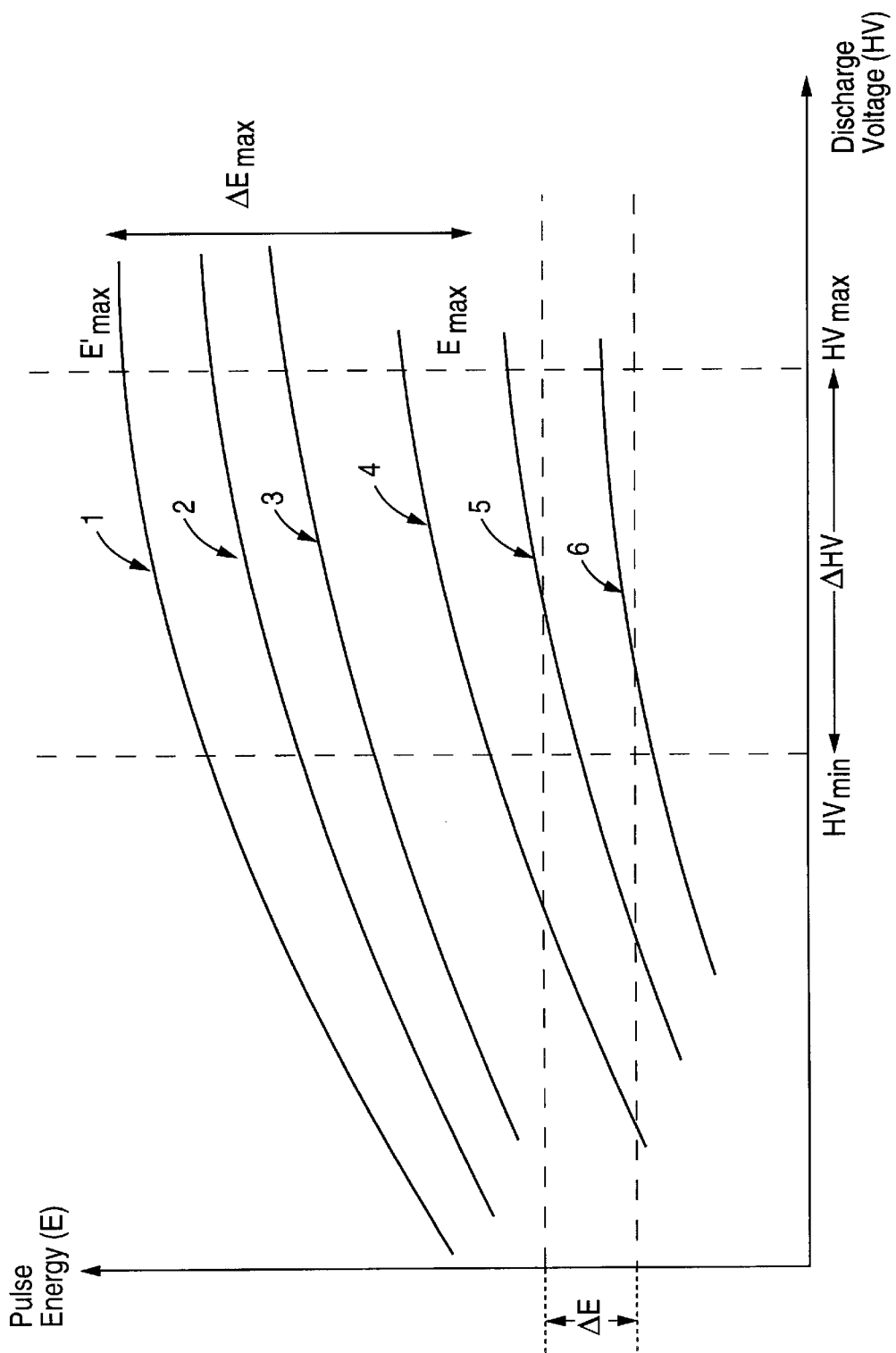
FIG. 3 shows various plots of pulse energy versus discharge voltage corresponding to various stages of aging of the optics of the line-narrowing module and/or laser tube of a laser system in accord with a preferred embodiment.

FIG. 3 illustrates the advantages of the laser system in accord with a preferred embodiment, particularly when contrasted with FIG. 1. FIG. 3 shows various plots of pulse energy versus discharge voltage corresponding to various stages of aging of the optics of the line-narrowing module and/or of the laser tube of a laser system in accord with the preferred embodiment.

As shown in FIG. 3, curve 1 represents the energy versus driving voltage of the laser system of the preferred embodiment when the optics are new. Even when the driving voltage is set as low as $HV_{min}$, the predetermined pulse energy $E_0$ (which lies within the range $\Delta E$) cannot be produced without the attenuation that is advantageously used to bring the energy within the range $\Delta E$ when desired.

The highest available pulse energy of the laser system is $E'_{max}$, as shown, wherein the discharge voltage is set at $HV_{max}$ and the laser is operating with new optics according to curve 1. The highest available energy $E'_{max}$ in accord with the preferred embodiment, is shown to be above the highest available energy $E_{max}$ of the conventional laser system by an amount $\Delta E_{max}$. Moreover, the attenuation may be set to reduce the pulse energy to below the minimum energy achievable with the conventional laser system, if desired. The laser system of the preferred embodiment thus advantageously has a greater pulse energy versatility than the conventional laser system.

When the optics and/or the laser tube are aged such that the laser is operating according to curves 2–4 of FIG. 3, a lesser amount of attenuation is used to produce the predetermined energy $E_0$. When the optics are aged such that the laser is operating according to curves 5–6 of FIG. 3, then it is possible to achieve the predetermined pulse energy $E_0$ without using any attenuation. Referring to FIG. 1, the conventional laser system could not produce the predetermined energy $E_0$ even when the optics had aged only so that the laser system was operating according to curve 4. Thus, the "lifetime" of the line-narrowing module, the lifetime of the optics, or the lifetime of the laser tube, or a combination thereof, of the laser system of the preferred embodiment is advantageously increased.

Figure 4:
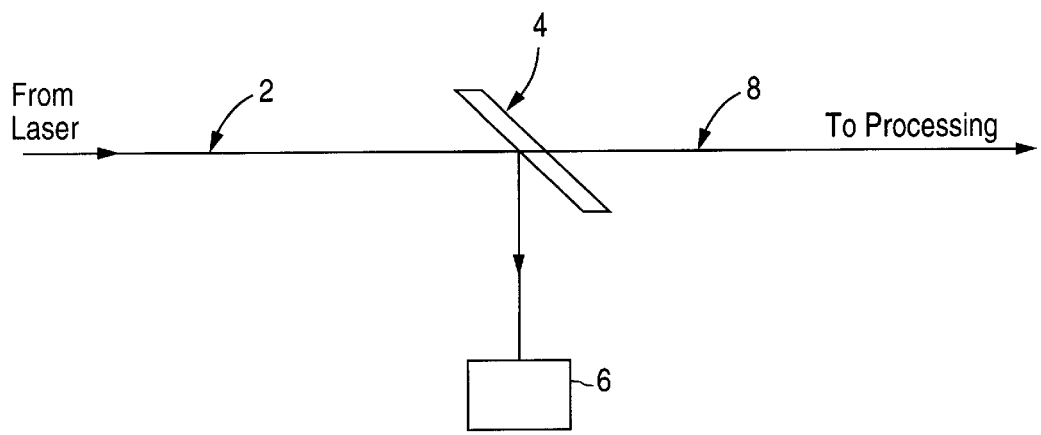
FIG. 4 schematically shows a first setup for attenuating the pulse energy of a laser beam in accord with a preferred embodiment.

FIG. 4 schematically shows a first preferred setup for attenuating the pulse energy of a laser beam in accord with a preferred embodiment. The following description of the preferred setup is not intended to limit the scope of this application, and is only illustrative, of arrangements that may be used for reducing the energy of a laser beam outcoupled from a laser system, and preferably an excimer or molecular fluorine laser system, to a predetermined energy used preferably for an industrial application and alternatively for a scientific, medical or other application process. By attenuating the beam, the energy of the outcoupled beam may be higher than is desired for the application process when the laser optics, tube, etc. have not aged, such that when the laser has aged even more than to an age when conventional laser system would requirement servicing including replacement of one or more optical components such as prisms, windows, etc., the line-narrowing module or the laser tube, the laser of the preferred embodiment may continue to be used for the application process.

Referring now to the illustrative example of FIG. 4, a laser beam 2 is outcoupled from a laser resonator, such as that of an excimer or molecular fluorine laser such as that which is preferred and described with reference to FIG. 7, below. The beam 2 impinges upon a reflective attenuator 4. Although not preferred, the attenuator 4 may alternatively be an absorption attenuator, such as to absorb the same percentage of incident light as the preferred reflective attenuator 4 would reflect, or a combination of reflection and absorption may be used. A desired percentage of the intensity of the beam 2 is preferably reflected to the module 6, and an attenuated beam 8 transmits through the attenuator 4 and continues on toward an industrial processing application.

The attenuator plate 4 can be arranged at Brewster's angle to have only a coating on one side of the plate, while the other side is uncoated and doesn't influence a $\pi$-polarized laser. In this case, the degree of $\pi$-polarization of the laser beam 8 can be increased over that of the beam 2.

The attenuator 4 has a certain reflectivity. The attenuator 4 may be replaced with another one having a different reflectivity depending on the amount of attenuation that is desired. The laser beam may be polarized and the attenuator 4 may in that case be configured to reflect a certain percentage of the polarization component of the laser. The laser may be polarized using Brewster surfaces such as the laser tube windows, prism surfaces or otherwise. A polarization plate may be inserted into the resonator, as well. The outcoupling of the beam 2 may be polarization coupled at an angled optical surface within the resonator or through a partially reflective resonator reflector. The attenuator 4 may have a coating for reflecting a certain percentage of the laser beam 2, such as a polarization sensitive reflection coating.

Several attenuators may be selectively interchanged depending on the amount of attenuation desired. For example, attenuators having reflection coefficients of 40%, 30%, 20% and 10% may be readily available to the operator of the laser system, and may be interchanged after predetermined amounts of laser operation and corresponding aging, and a processor may control the laser output energy according to the attenuator being used.

The module 6 may be a beam dump, or it may be a diagnostic module such as a pulse energy, power or array detector to monitor the pulse energy, moving average energy or power, temporal pulse shape or spatial profile, beam alignment, divergence or spectral distribution, wavelength, or bandwidth of the beam or other beam parameter, and the module 6 may include an inspection window. Thus, the attenuator 4 may serve the dual role of attenuating the beam 2 and reflecting part of the beam 2 to a diagnostic module of the module 6, shown in FIG. 4. Uses of such a diagnostic module may be as described at U.S. patent applications Ser. Nos. 09/447,882, 09/416,344, 09/379,034, No. 60/166,854, Ser. Nos. 09/271,020, 09/162,424, No. 60/166,952 and/or Ser. No. 09/532,276, each of which is assigned to the same assignee as the present application, and is hereby incorporated by reference.

The attenuation may alternatively be controlled by adjusting a trace amount of a gas additive to the gas mixture such as preferably xenon (see U.S. patent application Ser. No. 09/513,025, assigned to the same assignee as the present application and hereby incorporated by reference), or argon, krypton, oxygen, HCl, $CO_2$, $CF_4$, or $N_2$. A gas control unit would adjust the amount of the gas additive according to the amount of attenuation desired, in accord with the aging stage of the optics.

Figure 5:
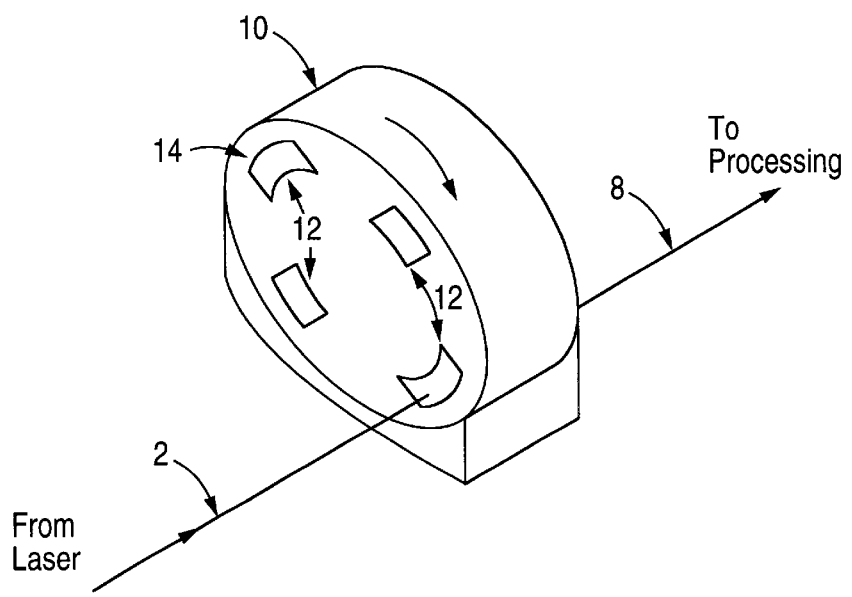
FIG. 5 schematically shows a second setup for adjustably attenuating the pulse energy of a laser beam in accord with a preferred embodiment.

FIG. 5 schematically shows a second preferred setup for adjustably attenuating the pulse energy of a laser beam in accord with a preferred embodiment. Again, the beam 2 is outcoupled from a laser resonator. The beam impinges upon an attenuation unit 10 including multiple attenuation plates 12. Each attenuation plate 12 corresponds to a different degree of attenuation, such as 10%–40% as described above.

One skilled in the art would realize that attenuation plates above 40% and at lower intervals than 10% may be used, and that more or less than four may be provided.

The attenuation unit 10 has a face 14 that includes the plates 12. The face 14 is rotatable so that the plate 12 having the attenuation characteristics desired may be "clicked" into place in the path of the beam 2. The plates 12 may also be set up in a modified attenuation unit to slide into place individually, or to rotate like a revolving door selectively into place.

Figure 6:
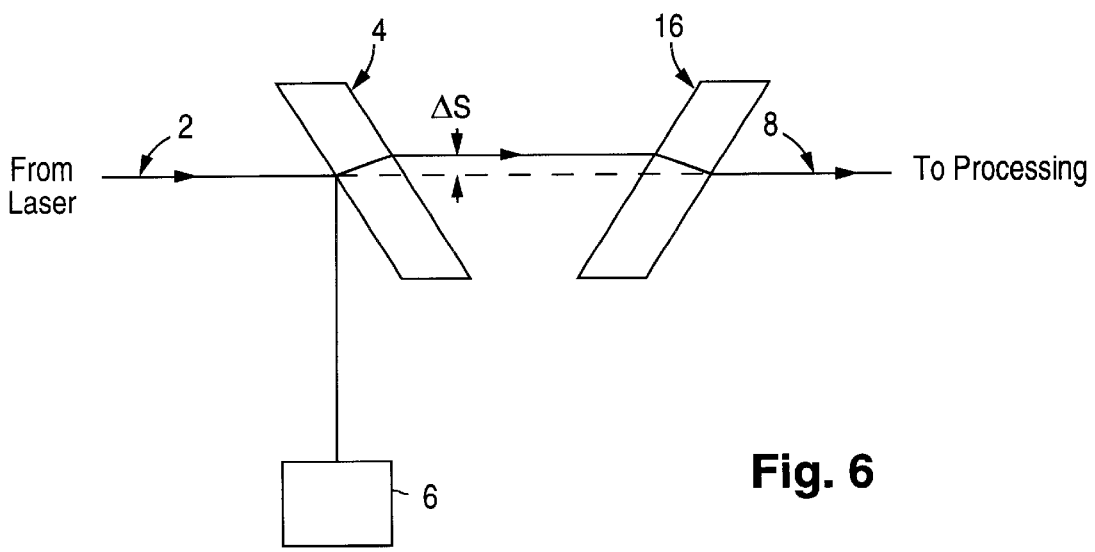
FIG. 6 schematically shows a third setup for attenuating the pulse energy of a laser beam and compensating a beam alignment in accord with a preferred embodiment.

FIG. 6 schematically shows an arrangement according to a preferred embodiment including the attenuator plate 4 and module 6 including a diagnostic module and/or beam dump similar to those shown and described with respect to FIG. 4, above. As can be seen in FIG. 6, an alignment of the beam 2 is moved a distance $\Delta s$ from its original path as a consequence of traversing the attenuator 4. In order to move the beam back to its original path, a compensator plate 16 according to a preferred embodiment is inserted after the attenuator 4, and may alternatively be disposed before the attenuator 4. A same or a different compensator may be configured to be used together with each attenuator 12 of the variable attenuator design of FIG. 5.

Figure 7:
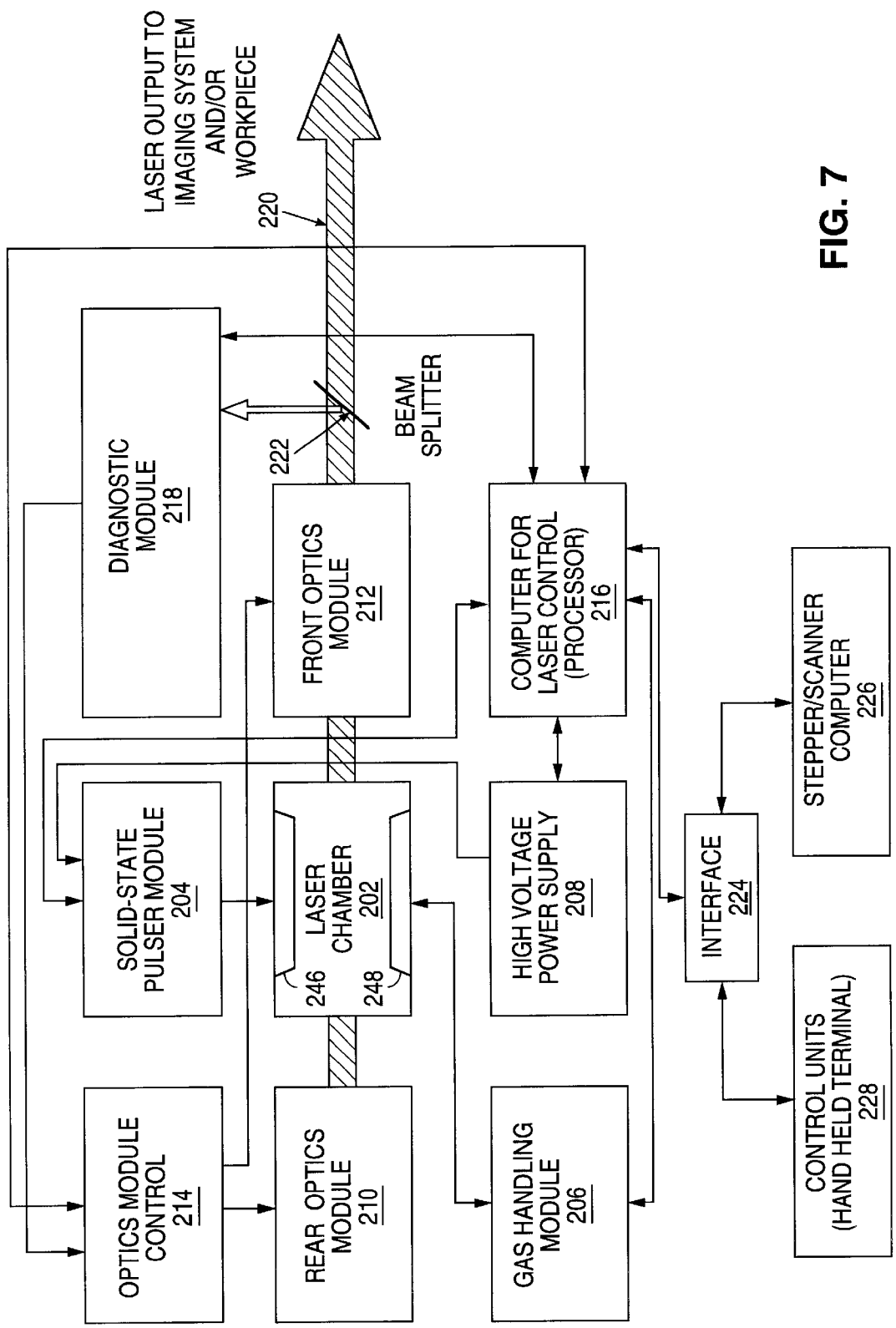
FIG. 7 schematically shows an excimer or molecular fluorine laser system in accord with a preferred embodiment.

Referring now to FIG. 7, the preferred excimer or molecular fluorine laser system will now be described. A gas discharge laser system, preferably a DUV or VUV laser system, such as an excimer laser, e.g., ArF or KrF, or a molecular fluorine (F2) laser system for deep ultraviolet (DUV) or vacuum ultraviolet (VUV) lithography, is schematically shown at FIG. 7. Alternative configurations for laser systems for use in such other industrial applications as TFT annealing and/or micromachining, e.g., are understood by those skilled in the art as being similar to and/or modified from the system shown in FIG. 7 to meet the requirements of that application. For this purpose, alternative DUV or VUV laser system and component configurations are described at U.S. patent applications Ser. Nos. 09/317,695, 09/130,277, 09/244,554, 09/452,353, 09/317,527, 09/343, 333, Nos. 60/122,145, 60/140,531, 60/162,735, 60/166,952, 60/171,172, 60/141,678, 60/173,993, 60/166,967, 60/147, 219, 60/170,342, 60/162,735, 60/178,445, 60/166,277, 60/167,835, 60/171,919, Ser. No. 09/640,595, Nos. 60/202, 564, 60/204,095, 60/172,674, Ser. No. 09/574,921 and No. 60/181,156, and U.S. Pat. Nos. 6,005,880, 6,061,382, 6,020, 723, 5,946,337, 6,160,832, 6,160,831, 6,157,662, 6,154,470, 6,014,206, 5,559,816, 4,611,270, 5,761,236, 4,393,505, 4,905,243, 6,081,542, 6,061,382, 4,916,707, and 4,977,573 each of which is assigned to the same assignee as the present application, and those references set forth above, are hereby incorporated by reference.

The No. 60/140,531 application describes a $F^2$-laser oscillator and a master oscillator and power amplifier, where the master oscillator is a narrow linewidth 157 nm oscillator. The No. 60/140,531 application describes a narrow linewidth and relatively low power $F_2$-laser (157 nm) source that is followed by the power amplifier. The present application describes a laser oscillator followed by an attenuator, which may provide variable attenuation, for reducing the energy of the beam generated by the oscillator. Accordingly, a laser oscillator may be followed by an attenuator, which may provide variable attenuation, which is then followed by an amplifier. The beam generated by the oscillator then has its energy reduced as it traverses the attenuator, and then the beam has its energy increased as it traverses the amplifier.

The system shown in FIG. 7 generally includes a laser chamber 202 having a pair of main discharge electrodes 46, 48, e.g., as referred briefly to above, connected with a solid-state pulser module 204, and a gas handling module 206. The solid-state pulser module 204 is powered by a high voltage power supply 208. The laser chamber 202 is surrounded by optics module 210 and optics module 212, forming a resonator. The optics module 210 is preferably controlled by an optics control module 214, or may be alternatively directly controlled by a computer 216, and the front optics module 212 is preferably controlled by the control unit 70 described above, which may be a part of or separate from the module 214.

The computer 216 for laser control receives various inputs and controls various operating parameters of the system. A diagnostic module 218 receives and measures one or more parameters of a split off portion of the main beam 220 via optics for deflecting a small portion of the beam toward the module 218, such as preferably a beam splitter module 222, as shown. The beam 220 is preferably the laser output to an imaging system (not shown) and ultimately to a workpiece (also not shown), and may be output directly to an application process. In accord with the preferred embodiments described above, the beam 220 is the same as the beam 2 of FIGS. 4–6 and is attenuated by the attenuator 4 or 10 before proceeding to the imaging system or application process. The laser control computer 216 communicates through an interface 224 with a stepper/scanner computer 226 and other control units 228.

Laser Chamber

The laser chamber 202 contains a laser gas mixture and includes one or more preionization electrodes (not shown) in addition to the pair of main discharge electrodes 46, 48. Preferred main electrodes 46 and 48 are described at U.S. patent applications Ser. No. 09/453,670 and No. 60/184,705, each of which is assigned to the same assignee as the present application and is hereby incorporated by reference. Other electrode configurations are set forth at U.S. Pat. Nos. 5,729,565 and 4,860,300, each of which is assigned to the same assignee, and alternative embodiments are set forth at U.S. Pat. Nos. 4,691,322, 5,535,233 and 5,557,629, all of which are hereby incorporated by reference. Preferred preionization units are described at U.S. patent application Ser. No. 09/692,265 and details and alternative configurations are additionally set forth at U.S. patent applications No. 60/127,237, Ser. Nos. 09/532,276 and 09/247,887, each of which is assigned to the same assignee as the present application, and alternative embodiments are set forth at U.S. Pat. Nos. 5,337,330, 5,818,865 and 5,991,324, all of the above patents and patent applications being hereby incorporated by reference.

Power Supply Circuit and Pulser Module

The solid-state pulser module 204 and high voltage power supply 208 supply electrical energy in compressed electrical pulses to the preionization and main electrodes 46, 48 within the laser chamber 202 to energize the gas mixture. Components of the preferred pulser module and high voltage power supply may be described at U.S. patent applications Nos. 60/149,392, 60/198,058, 60/204,095, Ser. Nos. 09/432,348 and 09/390,146, and No. 60/204,095, and U.S. Pat. Nos. 6,005,880 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872 and 5,729,562, each of which is hereby incorporated by reference. A conventional pulser module may generate electrical pulses in excess of one Joule of electrical power (see the '988 patent, mentioned above).

Laser Resonator

The laser resonator which surrounds the laser chamber 202 containing the laser gas mixture includes optics module 210 including line-narrowing optics for a line narrowed excimer or molecular fluorine laser, which may be replaced by a high reflectivity mirror or the like in a laser system wherein either line-narrowing is not desired, or if line narrowing is performed at the front optics module 212, or a spectral filter external to the resonator is used, or if the line-narrowing optics are disposed in front of the HR mirror, for narrowing the bandwidth of the output beam.

The laser chamber 202 is sealed by windows transparent to the wavelengths of the emitted laser radiation 220. The windows may be Brewster windows or may be aligned at another angle, e.g., 5°, to the optical path of the resonating beam. One of the windows may include the interferometer 60 described above which also serves to output couple the beam.

Extra-Resonator Features

After a portion of the output beam 220 passes the outcoupler of the optics module 212, that output portion impinges upon beam splitter module 222 which includes optics for deflecting a portion of the beam to the diagnostic module 218, or otherwise allowing a small portion of the outcoupled beam to reach the diagnostic module 218, while a main beam portion 220 is allowed to continue as the output beam 220 of the laser system. The beam splitter 222 may be the same or a different component from the attenuator 4 or 10 of the preferred embodiments described above. The diagnostic module 218 may include a photodiode 68 and/or a monitor etalon 82, and may be the same or a different component from the module 6, described above.

Preferred optics include a beamsplitter or otherwise partially reflecting surface optic. The optics may also include a mirror or beam splifter as a second reflecting optic. More than one beam splitter and/or HR mirror(s), and/or dichroic mirror(s) may be used to direct portions of the beam to components of the diagnostic module 218. A holographic beam sampler, transmission grating, partially transmissive reflection diffraction grating, grism, prism or other refractive, dispersive and/or transmissive optic or optics may also be used to separate a small beam portion from the main beam 220 for detection at the diagnostic module 218, while allowing most of the main beam 220 to reach an application process directly or via an imaging system or otherwise.

The output beam 220 may be transmitted at the beam splitter module 222 while a reflected beam portion is directed at the diagnostic module 218, or the main beam 220 may be reflected, while a small portion is transmitted to the diagnostic module 218. The portion of the outcoupled beam which continues past the beam splitter module 222 is the output beam 220 of the laser, which propagates toward an industrial or experimental application such as an imaging system and workpiece for photolithographic applications. Variations of beam splitter modules 222 particularly for a molecular fluorine laser system are set forth at U.S. patent applications Ser No. 09/598,552, Nos. 60/177,809 and 60/140,530, which are each assigned to the same assignee as the present application and are hereby incorporated by reference.

Beam Path Enclosure

Also particularly for the molecular fluorine laser system, and for the ArF laser system, an enclosure (not shown) may seal the beam path of the beam 220 such as to keep the beam path free of photoabsorbing species. Smaller enclosures may seal the beam path between the chamber 202 and the optics modules 210 and 212 and between the beam splitter module 222, which itself may be within the same or a separate enclosure, and the diagnostic module 218. The preferred enclosure is described in detail in U.S. patent applications Ser. Nos. 09/343,333, 09/598,552, 09/594,892, 09/131,580 and No. 60/140,530, each of which is assigned to the same assignee and is hereby incorporated by reference, and U.S. Pat. Nos. 5,559,584, 5,221,823, 5,763,855, 5,811,753 and 4,616,908, all of which are hereby incorporated by reference.

Diagnostic Module

The diagnostic module 218 preferably includes at least one energy detector. This detector measures the total energy of the beam portion that corresponds directly to the energy of the output beam 220 (see U.S. Pat. No. 4,611,270 and U.S. patent application Ser. No. 09/379,034, each of which is assigned to the same assignee and is hereby incorporated by reference). An optical configuration such as an optical attenuator, e.g., a plate or a coating, or other optics may be formed on or near the detector or beam splitter module 222 to control the intensity, spectral distribution and/or other parameters of the radiation impinging upon the detector (see U.S. patent applications Ser. No. 09/172,805, Nos. 60/172, 749, 60/166,952 and 60/178,620, each of which is assigned to the same assignee as the present application and is hereby incorporated by reference).

One other component of the diagnostic module 218 is preferably a wavelength and/or bandwidth detection component such as a monitor etalon or grating spectrometer (see U.S. patent applications Ser. No. 09/416,344, Nos. 60/186, 003, 60/158,808, 60/186,096, 60/186,096 and 60/186,096 and 60/202,564, each of which is assigned to the same assignee as the present application, and U.S. Pat. Nos. 4,905,243, 5,978,391, 5,450,207, 4,926,428, 5,748,346, 5,025,445, and 5,978,394, all of the above wavelength and/or bandwidth detection and monitoring components being hereby incorporated by reference. This monitor etalon can be the same one described above with respect to FIGS. 9a and 9b, or a second monitor etalon. The spectrometer may be within a temperature and pressure controlled housing such as is described in the No. 60/158,808 application.

Other components of the diagnostic module may include a pulse shape detector or ASE detector, such as are described at U.S. patent applications Ser. Nos. 09/484,818 and 09/418, 052, respectively, each of which is assigned to the same assignee as the present application and is hereby incorporated by reference, such as for gas control and/or output beam energy stabilization, or to monitor the amount of amplified spontaneous emission (ASE) within the beam to ensure that the ASE remains below a predetermined level, as set forth in more detail below. There may be a beam alignment monitor, e.g., such as is described at U.S. Pat. No. 6,014,206 which is assigned to the same assignee and is hereby incorporated by reference.

Control Processor

The processor or control computer 216 receives and processes values of some of the pulse shape, energy, ASE, energy stability, energy overshoot for burst mode operation, wavelength, spectral purity and/or bandwidth, among other input or output parameters of the laser system and output beam. The processor 216 also controls the line narrowing module to tune the wavelength and/or bandwidth or spectral purity, and controls the power supply and pulser module 204 and 208 to control preferably the moving average pulse power or energy, such that the energy dose at points on the workpiece is stabilized around a desired value. In addition, the computer 216 controls the gas handling module 206 which includes gas supply valves connected to various gas sources.

Further details of the control processor 216 such as for performing burst overshoot control and controlling the gas supply unit by monitoring total input energy to the discharge, among other parameters, for determining the timing and amounts of gas replenishment actions, are described at U.S. patent application Ser. No. 09/588,561, which is assigned to the same assignee as the present application and is hereby incorporated by reference.

Gas Mixture

The laser gas mixture is initially filled into the laser chamber 202 during new fills. The gas composition for a very stable excimer or molecular fluorine laser in accord with the preferred embodiment uses helium or neon or a mixture of helium and neon as buffer gas(es), depending on the particular laser being used. Preferred gas compositions are described at U.S. Pat. Nos. 4,393,405 and 4,977,573 and U.S. patent applications Ser. Nos. 09/317,526, 09/513,025, No. 60/124,785, Ser. No. 09/418,052, Nos. 60/159,525 and 60/160,126, each of which is assigned to the same assignee and is hereby incorporated by reference into the present application. The concentration of the fluorine in the gas mixture may range from 0.003% to 1.00%, and is preferably around 0.1%. An additional gas additive, such as a rare gas, such as xenon, may be added for increased energy stability and/or as an attenuator as described in the Ser. No. 09/513, 025 application incorporated by reference above. Specifically, for the F2-laser, an addition of xenon and/or argon may be used. The concentration of xenon or argon in the mixture may range from 0.0001% to 0.1%. For an ArF-laser, an addition of xenon or krypton may be used also having a concentration between 0.0001% to 0.1%. For the KrF laser, an addition of xenon or argon may be used also having a concentration between 0.0001% to 0.1%.

Gas Replenishment, General

Halogen and rare gas injections, total pressure adjustments and gas replacement procedures are performed using the gas handling module 206 preferably including a vacuum pump, a valve network and one or more gas compartments. The gas handling module 206 receives gas via gas lines connected to gas containers, tanks, canisters and/or bottles. Some prefered and alternative gas handling and/or replenishment procedures are described at U.S. Pat. Nos. 4,977, 573 and 5,396,514 and U.S. patent applications No. 60/124, 785, Ser. Nos. 09/418,052, 09/379,034, Nos. 60/159,525, 60/171,717, and 60/159,525, each of which is assigned to the same assignee as the present application, and U.S. Pat. Nos. 5,978,406, 6,014,398 and 6,028,880, all of which are hereby incorporated by reference. A xenon gas supply may be included either internal or external to the laser system according to the '025 application, mentioned above.

Line-Narrowing

A general description of the line-narrowing features of the preferred embodiment is provided here, followed by a listing of patent and patent applications being incorporated by reference as describing variations and features that may used with the preferred embodiments described above for providing an output beam with a high spectral purity or bandwidth (e.g., below 0.6 pm). Exemplary line-narrowing optics contained in the optics module 210 include a beam expander, an optional etalon and a diffraction grating, which produces a relatively high degree of dispersion, for a narrow band laser such as is used with a refractive or catadioptric optical lithography imaging system. As referred to above, the front optics module 212 may include line-narrowing optics (e.g., outcoupling interferometer, birefringent plate, grating, grism) as well (see the Nos. 60/166,277, 60/173,993 and 60/166,967 applications, each being assigned to the same assignee and hereby incorporated by reference).

The beam expander of the above exemplary line-narrowing optics of the optics module 210, and that of the embodiment described above in front of the output coupling interferometer 60, preferably includes one or more prisms. The beam expander may include other beam expanding optics such as a lens assembly or a converging/diverging lens pair. The grating or a highly reflective mirror is preferably rotatable and in Littrow configuration so that the wavelengths reflected into the acceptance angle of the resonator can be selected or tuned. Alternatively, the grating, or other optic or optics, or the entire line-narrowing module may be pressure tuned, such as is set forth in the No. 60/178,445 and Ser. No. 09/317,527 applications, each of which is assigned to the same assignee and is hereby incorporated by reference. The grating may be used both for dispersing the beam for achieving narrow bandwidths and also preferably for retroreflecting the beam back toward the laser tube 202. Alternatively, a highly reflective mirror may be positioned before or after the grating which receives a reflection from the grating and reflects the beam back toward the grating, such as in a Littman configuration, or the grating may be a transmission grating. One or more dispersive prisms may also be used, and more than one etalon may be used.

Depending on the type and extent of line-narrowing and/or selection and tuning that is desired, and the particular laser that the line-narrowing optics are to be installed into, there are many alternative optical configurations that may be used. For this purpose, those shown in U.S. Pat. Nos. 4,399,540, 4,905,243, 5,226,050, 5,559,816, 5,659,419, 5,663,973, 5,761,236, 6,081,542, 6,061,382 and 5,946,337, and U.S. patent applications Ser. Nos. 09/317,695, 09/130, 277, 09/715,803, Nos. 60/181,158, 60/218,417, Ser. No. 09/584,420, Nos. 60/212,257, 60/212,301, 60/215,933, Ser. Nos. 09/244,554, 09/317,527, 09/073,070, Nos. 60/124,241, 60/140,532, 60/147,219 and 60/140,531, 60/147,219, 60/170,342, 60/172,749, 60/178,620, 60/173,993, 60/166, 277, 60/166,967, 60/167,835, 60/170,919, 60/186,096, each of which is assigned to the same assignee as the present application, and U.S. Pat. Nos. 5,095,492, 5,684,822, 5,835, 520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, are each hereby incorporated by reference into the present application.

Optics module 212 preferably includes means for outcoupling the beam 220, such as a partially reflective resonator reflector. The beam 220 may be otherwise outcoupled such as by an intra-resonator beam splitter or partially reflecting surface of another optical element, and the optics module 212 would in this case include a highly reflective mirror. The optics control module 214 preferably controls the optics modules 210 and 212 such as by receiving and interpreting signals from the processor 216, and initiating realignment or reconfiguration procedures (see the '241, '695, '277, '554, and '527 applications mentioned above).

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the steps have been ordered in selected typographical sequences. However, the sequences have been selected and so ordered for typographical convenience and are not intended to imply any particular order for performing the steps, except for those claims wherein a particular ordering of steps is expressly set forth or understood by one of ordinary skill in the art as being necessary.

What is claimed is:

1. An excimer or molecular fluorine laser system, comprising:

a laser chamber filled with a gas mixture at least including molecular fluorine and a buffer gas, the laser chamber including at least one window for emitting wavelengths of radiation generated in the laser chamber;

a plurality of electrodes disposed within the laser chamber and defining a discharge region therebetween;

a pulsed discharge circuit coupled to the plurality of electrodes, the pulsed discharge circuit including a pulser module and a high voltage power supply, wherein the pulsed discharge circuit operates to apply discharge pulses to the electrodes for energizing the gas mixture occupying the discharge region;

a resonator, for receiving wavelengths of radiation emitted from the window, the resonator including the laser chamber and a line-narrowing module, the resonator including a pair of resonator reflector surfaces for generating a line-narrowed laser beam, and outputting the beam on a laser beam path which is directed to an object which is lithographically processed, by the beam being incident on the object;

an attenuator disposed in the beam path such that the laser beam traverses the attenuator, whereby an energy of the laser beam is reduced to a predetermined energy for lithographic processing; and wherein said attenuator includes an attenuator plate for reflecting away a first portion of the beam and for transmitting a second portion of said beam as an output beam of said laser system, and wherein said laser system further comprises a compensator plate for compensating a shift of the beam produced by refraction through said attenuator plate.

2. The laser system of claim 1, wherein said attenuator is disposed outside of said resonator of said laser system.

3. The laser system of claim 1, wherein the attenuator includes one or more attenuator plates arranged-at Brewster's angle.

4. The laser system of claim 1, wherein the attenuator includes one or more attenuator plates each including a reflective coating.

5. The laser system of claim 1, wherein the attenuator includes one or more attenuator plates, and wherein a reflectivity of the one or more plates is polarization coupled.

6. The laser system of claim 1, wherein the discharge circuit is configured to operate in a range between a minimum voltage and a maximum voltage, and wherein when the minimum voltage is applied across the electrodes, the energy of laser pulses before impinging upon the attenuator is greater than the predetermined energy.

7. An excimer or molecular fluorine laser system, comprising:
- a laser chamber filled with a gas mixture at least including molecular fluorine and a buffer gas, the laser chamber including at least one window for emitting wavelengths of radiation generated in the laser chamber;
- a plurality of electrodes disposed within the laser chamber and defining a discharge region therebetween;
- a pulsed discharge circuit coupled to the plurality of electrodes, the pulsed discharge circuit including a pulser module and a high voltage power supply, wherein the pulsed discharge circuit operates to apply discharge pulses to the electrodes for energizing the gas mixture occupying the discharge region;
- a resonator, for receiving wavelengths of radiation emitted from the window, the resonator including the laser chamber and a line-narrowing module, the resonator including a pair of resonator reflector surfaces for generating a line-narrowed laser beam, and outputting the beam on a laser beam path which is directed to an object which is lithographically processed, by the beam being incident on the object;
- an attenuator disposed in the beam path such that the laser beam traverses the attenuator, whereby an energy of the laser beam is reduced to a predetermined energy for lithographic processing; and
- wherein said attenuator is disposed outside of said resonator of said laser system, said attenuator for reflecting a first portion of the beam to a diagnostic module for monitoring one or more parameters of said beam selected from the group of beam parameters consisting of energy, bandwidth, wavelength, temporal pulse shape, spatial profile, beam alignment, beam divergence and spectral distribution.

8. The laser system of claim 7, wherein the discharge circuit is configured to operate in a range between a minimum voltage and a maximum voltage, and wherein when the minimum voltage is applied across the electrodes, the energy of the beam before impinging upon the attenuator is greater than the predetermined energy.

9. The laser system of claim 7, wherein the attenuator is disposed in a housing flushed with an inert gas.

10. The laser system of claim 9, wherein the inert gas is selected from the group of inert gases consisting of nitrogen and argon.

11. The laser system of claim 7, wherein the attenuator is driven by a motor for adjusting the attenuation.

12. The laser system of claim 7, wherein said diagnostic module includes an energy detector for detecting an energy of the reflected beam.

13. The laser system of claim 7, wherein said diagnostic module includes a spectrometer for determining a spectral parameter of the reflected beam.

14. The laser system of claim 7, wherein said diagnostic module includes a detector for measuring a parameter of the reflected beam selected from the group of parameters consisting of temporal pulse shape, spatial profile, beam alignment, beam divergence and spectral distribution.

15. The laser system of claim 7, wherein said diagnostic module includes an inspection window.

16. An excimer or molecular fluorine laser system, comprising:
- a laser chamber filled with a gas mixture at least including molecular fluorine and a buffer gas, the laser chamber including at least one window for emitting wavelengths of radiation generated in the laser chamber;
- a plurality of electrodes disposed within the laser chamber and defining a discharge region therebetween;
- a pulsed discharge circuit coupled to the plurality of electrodes, the pulsed discharge circuit including a pulser module and a high voltage power supply, wherein the pulsed discharge circuit operates to apply discharge pulses to the electrodes for energizing the gas mixture occupying the discharge region;
- a resonator, for receiving wavelengths of radiation emitted from the window, the resonator including the laser chamber and a line-narrowing module, the resonator including a pair of resonator reflector surfaces for generating a line-narrowed laser beam, and outputting the beam on a laser beam path which is directed to an object which is lithographically processed, by the beam being incident on the object;
- an attenuator disposed in the beam path such that the laser beam traverses the attenuator, whereby an energy of the laser beam is reduced to a predetermined energy for lithographic processing; and
- wherein said attenuator includes an attenuator plate for reflecting away a first portion of the beam and for transmitting a second portion of said beam as an output beam of said laser system.

17. The laser system of claim 16, wherein the attenuator has variable attenuation for reducing several output pulse energies of the beam each to said predetermined pulse energy.

18. The laser system of claim 17, wherein said several output pulse energies are energies of output pulses produced by application of a same input voltage from said discharge circuit to said electrodes at different stages of aging of optics of said line-narrowing module.

19. The laser system of claim 17, wherein said attenuator includes a slot for insertion of any of a plurality of attenuator plates for adjusting the variable attenuation of the attenuator.

20. An excimer or molecular fluorine laser system, comprising:
- a laser chamber filled with a gas mixture at least including molecular fluorine and a buffer gas, the laser chamber including at least one window for emitting wavelengths of radiation generated in the laser chamber;
- a plurality of electrodes disposed within the laser chamber and defining a discharge region therebetween;
- a pulsed discharge circuit coupled to the plurality of electrodes, the pulsed discharge circuit including a pulser module and a high voltage power supply, wherein the pulsed discharge circuit operates to apply discharge pulses to the electrodes for energizing the gas mixture occupying the discharge region;
- a resonator, for receiving wavelengths of radiation emitted from the window, the resonator including the laser chamber and a line-narrowing module, the resonator including a pair of resonator reflector surfaces for generating a line-narrowed laser beam, and outputting the beam on a laser beam path which is directed to an object which is lithographically processed, by the beam being incident on the object;

an attenuator disposed in the beam path such that the laser beam traverses the attenuator, whereby an energy of the laser beam is reduced to a predetermined energy for lithographic processing, the attenuator having variable attenuation for reducing several output pulse energies of the beam each to said predetermined pulse energy; and wherein the attenuator includes a plurality of attenuator plates for reflecting a portion of the output energy of pulses of the beam, each plate having a different reflectivity.

21. An excimer or molecular fluorine laser system, comprising:

a laser chamber filled with a gas mixture at least including molecular fluorine and a buffer gas, the laser chamber including at least one window for emitting wavelengths of radiation generated in the laser chamber;

a plurality of electrodes disposed within the laser chamber and defining a discharge region therebetween;

a pulsed discharge circuit coupled to the plurality of electrodes, the pulsed discharge circuit including a pulser module and a high voltage power supply, wherein the pulsed discharge circuit operates to apply discharge pulses to the electrodes for energizing the gas mixture occupying the discharge region;

a resonator, for receiving wavelengths of radiation emitted from the window, the resonator including the laser chamber and a line-narrowing module, the resonator including a pair of resonator reflector surfaces for generating a line-narrowed laser beam, and outputting the beam on a laser beam path which is directed to an object which is lithographically processed, by the beam being incident on the object;

an attenuator disposed in the beam path such that the laser beam traverses the attenuator, whereby an energy of the laser beam is reduced to a predetermined energy for lithographic processing, the attenuator having variable attenuation for reducing several output pulse energies of the beam each to said predetermined pulse energy; and wherein said attenuator includes a rotatable holder for holding a plurality of attenuator plates for reflecting a portion of the energy of pulses of the outcoupled laser beam, each plate being rotatable into the path of the laser beam for selecting an amount of attenuation depending on the pulse energy of pulses of the outcoupled laser beam and a value of the predetermined energy.

* * * * *